United States Patent [19]

Tung

[11] Patent Number: 4,881,046
[45] Date of Patent: Nov. 14, 1989

[54] MICROWAVE LINEAR AMPLIFIER WITH VERY WIDE PASS BAND

[75] Inventor: Pham N. Tung, Paris, France

[73] Assignee: Thompson Hybrides et Microondes, Paris, France

[21] Appl. No.: 275,382

[22] Filed: Nov. 23, 1988

[30] Foreign Application Priority Data

Nov. 27, 1987 [FR] France ............................. 87 16466

[51] Int. Cl.$^4$ ............................................. H03F 3/16
[52] U.S. Cl. ...................................... 330/277; 330/296
[58] Field of Search ............... 330/253, 277, 286, 287, 330/296, 311, 300

[56] References Cited

U.S. PATENT DOCUMENTS 4,612,514  9/1986  Shigaki et al. ...................... 330/277

FOREIGN PATENT DOCUMENTS 2846687  4/1980  Fed. Rep. of Germany .

OTHER PUBLICATIONS

IEEE Journal of Solid-State Circuits, vol. SC-17, No. 6, Dec. 1982, pp. 1166-1173; D. B. Estreich.
IEEE Transactions on Microwave Theory and Techniques, vol. MTT-33, No. 8, Aug. 1985, pp. 686-692; Y. Imai et al.

Primary Examiner—Steven Mottola
Attorney, Agent, or Firm—Oblon, Spivak, McClelland, Maier & Neustadt

[57] ABSTRACT

A microwave linear amplifier is described. Its pass band is equal to that of the transistors which constitute it, without being limited by the usual biasing circuits which comprise chokes and capacitors with a narrow pass band. In this amplifier, which has at least one input transistor, the gate bias at neutral point is provided by a BFL type circuit, generally used in logic circuits, the output of which is looped to the input. The input signal is applied both to the inverter transistor of the BFL circuit and to the input transistor. The same BFL circuit used in the amplification stage provides for the self-matching of the stages which can be cascaded.

8 Claims, 2 Drawing Sheets

MICROWAVE LINEAR AMPLIFIER WITH VERY WIDE PASS BAND

BACKGROUND OF THE INVENTION

1. Field Of the Invention

The present invention concerns a microwave amplifier working in both linear and logic modes, having matching circuits which are modified as compared with standard amplifiers, so that it can have a very wide pass band of between 1 and 100 Gigahertz. In this amplifier, the gates of the transistors of the amplifier stages are biased at stable voltages given by circuits comprising only transistors and diodes, to the exclusion of circuits having resistors, chokes and capacitors which are commonly used in the prior art. The amplifier according to the invention is of a combined linear and logic type, for its linear amplification part is biased by assemblies which are habitually used in logic applications.

The invention can be applied essentially to microwave circuits made with gallium arsenide or, more generally, with fast materials of the III-V group.

2. Description of the Prior Art

It is known that logic circuits made of GaAs can work at frequencies ranging from some Mhz up to several tens of Ghz. In a ring assembly, the logic inverters may have minimum propagation times of about ten picoseconds. This shows that the logic circuits have a very wide pass band, covering all the frequencies up to 100 Ghz. The reason why a logic circuit has a very wide pass band is that, for the logic levels to be compatible with one other, the load and bias elements are made of semiconducting components such as diodes and transistors, which themselves have a very wide pass band.

It is also known that, in linear circuits, a microwave transistor can achieve amplification up to very high frequencies, but the problems related to microwave amplifiers arise out of the matching circuits, namely the biasing and load circuits, which have fairly narrow pass bands. For, the biasing circuits, for example, are generally made with a bias voltage, by means of resistors, chokes and capacitors which themselves have fairly narrow pass bands.

The invention therefore consists in the application of known logic circuits to match and bias the amplifier stages so as to obtain a linear amplifier with a very wide pass band.

To work efficiently, a microwave transistor (very usually of the field effect type) must have its gate biased, at neutral point, at a bias voltage which is accurately chosen according to the graphs of the transistor's intensity/voltage characteristics, but this bias voltage should be stable. It is standard practice to provide the bias voltage from a source which delivers it through a resistor which is series-mounted with a choke, a capacitor being mounted in parallel and grounded. These components take up a great deal of space in monolithic integration. This means that they are not desired for the manufacture of microwave integrated circuits made of GaAs but, in addition, they have a narrow pass band which limits that of the amplifier.

According to the invention, the gate of at least one field effect transistor in a microwave amplifier is biased, at neutral point, by a known logic circuit comprising a BFL (Buffered FET Logic) type inverter, followed by a shifter. The input signal is applied simultaneously to the gate of the input field-effect transistor of the inverter and to the gate of the input field effect transistor of the amplifier, which is itself connected to the output of the phase shifter: whenever the bias voltage at the gate of the amplifier transistor varies, the reaction of the BFL gate and the shifter brings this voltage back to its initial value.

Furthermore, the amplifier has at least one stage in which two transistors are mounted as differential amplifiers, in the manner of a NOR logic gate. The gate of the first transistor receives the input signal. The gate of the second transistor is biased by the output signal of this stage, through a circuit comprising an inverter and a shifter which are identical to the above-described circuit: this assembly enables the stabilization of the bias voltage of the second transistor of this stage and, at the same time, of the bias voltage of the input transistor of a following amplification stage. Several amplification stages can then be cascade-mounted since their inputs and their outputs are self-matched.

SUMMARY OF THE INVENTION

More precisely, the invention concerns a microwave linear amplifier with a very wide pass band comprising at least one field effect transistor, the gate of which receives an input signal; an amplifier wherein the biasing circuit, at neutral point, of the gate of this input transistor is formed by a BFL type logic circuit comprising:

an inverter formed by a transistor and its active load, powered from a first voltage source;

a shifter formed by a transistor with its gate connected to the drain of the transistor of the inverter, and with its source connected to at least one diode and one transistor which is a current source, the shifter being powered between the first voltage source and a second negative voltage source, the input signal being applied simultaneously to the gate of the transistor of the inverter and to the gate of the input transistor of the amplifier, said gate being furthermore connected to the output point of the shifter, common to the cathode of the diode and to the drain of the current source transistor.

BRIEF DESCRIPTION OF THE DRAWINGS

The invention will be better understood from the more detailed description, which now follows, of an embodiment of a microwave circuit with a very wide pass band, said description being made with reference to the appended figures, of which.

DESCRIPTION OF A PREFERRED EMBODIMENT

Figure 1:
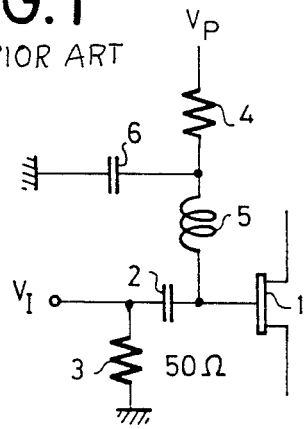
FIG. 1 shows a biasing circuit of a microwave field effect transistor according to the prior art.

FIG. 1, which shows a biasing circuit of a prior art microwave field effect transistor, is designed to recall the limits given by prior art techniques. A field effect transistor which is, for example, the input transistor of an amplifier, receives an input signal $V_I$ at its gate. This input signal $V_I$ is often applied, through a connecting capacitor 2, with an input impedance 3 which is very usually standardized at 50 Ohms. For the transistor 1 to work properly, this gate must be biased at a fixed voltage given by a source of bias voltage $V_p$, but this voltage is applied through a circuit such as the one shown, or through other types of circuit using passive components as opposed to semiconductor components. In the case of FIG. 1, which is therefore not an exhaustive example of the prior art, the bias voltage $V_p$ is limited through a resistor 4, series-mounted with a choke 5, while a capacitor 6 provides for uncoupling from the ground. The main drawback of this type of biasing circuit lies in the fact that the choke 5 and the capacitor 6 occupy a large amount of space on the chip of an integrated circuit, if this circuit is an integrated microwave circuit on a fast material of the III-V group, but, in any case, the circuit formed by a choke 5 and a capacitor 6 itself has a relatively narrow pass band which therefore limits the pass band of the amplifier biased through this biasing circuit.

Figure 2:
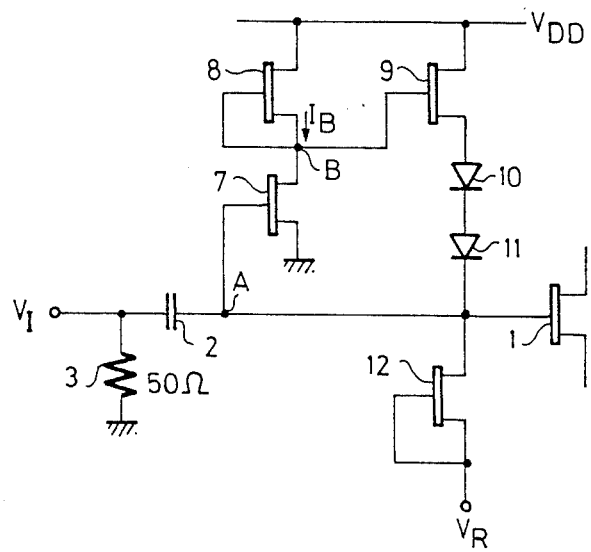
FIG. 2 shows a biasing circuit of a microwave field effect transistor according to the invention.

The basis of the invention consists, therefore, in giving a bias voltage by means of a circuit that uses only semiconducting components which themselves have a pass band as wide as that of the semiconducting components forming the amplifier. The biasing circuit according to the invention is shown in FIG. 2.

If the transistor 1 is considered to be the input transistor of a microwave amplifier, it receives the input signal $V_I$ at its gate, through a capacitor 2, with an impedance which is generally standardized at 50 Ohms by the resistor 3, hence under the same conditions as in the prior art. But the bias voltage applied to its gate at neutral point, i.e. when there is no input signal, is obtained by means of a circuit comprising a BFL type inverter followed by a shifter. The BFL gate consists of a field-effect transistor 7, charged by a load transistor 8, which is itself powered from a voltage $V_{DD}$. The drain of the transistor 7 is connected to the source of a transistor 8 which is itself short-circuited with its gate. The gate of the transistor 7 is connected at a point A to the input signal of the amplifier. At the common point B, between the drain of the transistor 7 and the source of the transistor 8, the inverted signal is applied to the gate of a transistor 9, the drain of which is itself powered by the voltage $V_{DD}$. The voltage of the source of the transistor 9 is shifted according to a method which, besides, is known, through one or two diodes 10 and 11 although, depending on the size of the shift desired, there may be a greater number of diodes. The cathode of the last of the shifting diodes is connected to a so-called pull-back transistor. The source and gate of this pull-back transistor, which are short-circuited, are powered by a negative voltage $V_R$.

Finally, the common point between the last of the shifting diodes and the drain of the pull-back transistor 12, which forms the output of this shifting stage, is connected to the gate of the input transistor 1 of the amplifier stage but, in addition, this point is looped to the point A, where the gate of the input transistor of the BFL gate is connected.

The input transistor 7 of the inverting stage has a transconductance $G_7$. The active load transistor 8 gives a current $I_B$. Let $V_A$ be the voltage at the point A, and let $V_T$ be the threshold voltage of the transistor 7. Whenever the voltage $V_A$ varies, the variation signal is inverted by the BFL inverter 7+8, then shifted through the transistor 9, mounted as a follower source, and through the diodes 10 and 11: the reaction of the shifter stage brings $V_A$ back to its initial value. For, it can be observed that the voltage at the point common to the diode 11, the gate of the transistor 1 and the drain of the transistor 12 is the same as the voltage at A. At equilibrium, we have:

$$I_B = G_7(V_A - V_T) \tag{1}$$

This assembly thus makes it possible to bias the gate of the input transistor 1 of the amplifier stage at a fixed and optimum level chosen according to the characteristic curves of this transistor 1.

Figure 3:
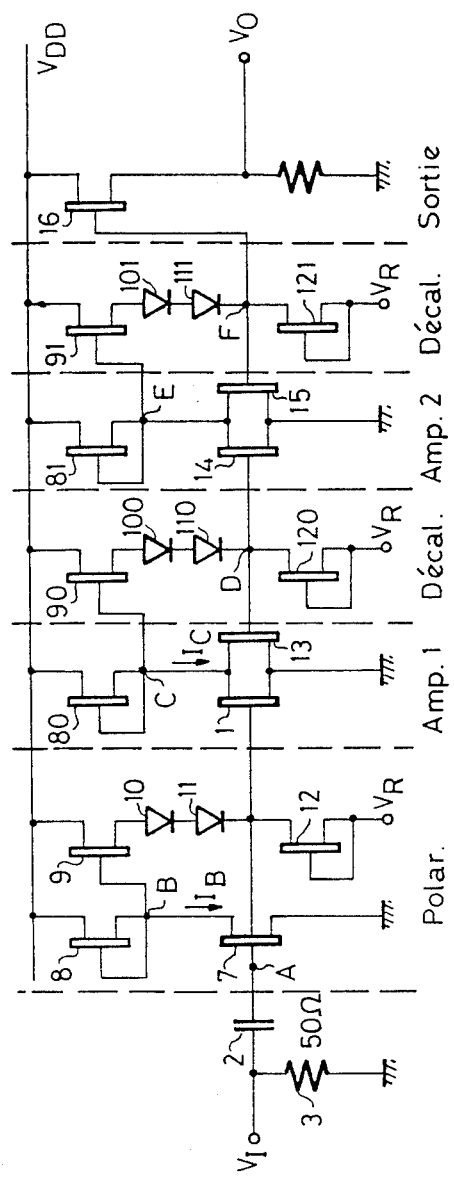
FIG. 3 is an electrical diagram of a microwave amplifier with a very wide pass band according to the invention.

FIG. 3 shows the electrical diagram of a very wide band amplifier circuit, using the biasing circuit, just described with reference to FIG. 2, for its input stage, as well as the same circuit to enable matching among the stages of the amplifier. This figure shows the following stages, separated by vertical dashes: the input bias stage, the first amplification stage, the first shifter stage, a second amplification stage and a second shifter stage, followed by an output stage. Let us briefly consider the bias stage and the first amplification stage, with its shifting or matching stage. Two amplification stages have been shown in this FIG. 3 but, more generally, the amplifier according to the invention may be capable of being cascaded and may have any number of amplification stages.

The bias stage is exactly identical, barring modifications in graphic representation, to the bias stage shown in FIG. 2. The transistor 7 of the BFL gate has been shown differently, in order to make it easier to note the repeatable nature of the circuit between the bias stage and the amplification stages.

The first amplification stage has a differential amplifier formed by the transistor 1, which therefore constitutes the input transistor of the amplifier, and the transistor 13. These two transistors are mounted with their sources grounded and with their drains connected to each other. This gives a resemblance with a NOR gate with two inputs in BFL logic assembly. The drain common to the two transistors 1 and 13 is connected to an active load 80, itself powered from a voltage $V_{DD}$ as are, besides, all the transistors of the amplifier. The source of the load 80, connected to the gate, supplies the gate of a transistor 90, mounted as a follower source. This follower source delivers current through two shifting diodes 100 and 110, with a point common to the gate of the transistor 13, the gate of the input transistor 14 of a following amplification stage, and the drain of a pull-back transistor 120, connected by its source to a negative voltage $V_R$. It can be seen that the reference indices of the components of the amplification stage and of the shifting stage or the stage for matching with the following stage have been intentionally chosen to highlight the similarity of the circuit with the biasing circuit. In this amplification stage, the BFL inverter is formed by the transistors 1 and 80, and the bias stage, with shifting, is formed by the transistor 90, and by the diodes 100 and 110 and the pull-back transistor 120. The difference between the bias stage and this first amplification stage is that a transistor 13 is connected in parallel with the transistor 1, and that it has its gate connected to the common point D. Let C designate the point common to the source of the transistor 80, the drain of the differential amplifier 11 +13 and the gate of the follower transistor 90. At equilibrium, we have:

$$I_C = I_1 + I_{13}$$

if $I_1$ and $I_{13}$ designate the currents flowing through the transistors 1 and 13.

$$I_C = G_1(V_A - V_T) + G_{13}(V_D - V_T) \quad (2)$$

$G_1$ and $G_{13}$ being the transconductance values of the transistors 1 and 13, the threshold voltages $V_T$ being the same for all the transistors of one and the same integrated circuit.

This equation 2 enables setting the equilibrium voltage $V_D$ at the point D, namely setting the bias voltage of both the transistor 13 and the transistor 14, hence the bias voltage on the input transistor of the following state.

By derivation in the equation 2, we get:

$$G_1 \Delta V_A + G_{13} \Delta V_D = 0$$

since $I_C$ is a constant. We deduce therefrom:

$$\Delta V_D = -\frac{G_1}{G_{13}} \Delta V_A = -A_1 \Delta V_A$$

$$\text{with } A_1 = \frac{G_1}{G_{13}}$$

which constitutes a factor of amplification. It can be noted, therefore, that to have amplification, $G_1$ should be greater than $G_{13}$, but we can also have attenuation if $G_{13}$ is chosen to be greater than $G_1$. The equation 3 shows that whenever the input voltage $V_A$ varies by $\Delta V_A$, the output voltage $V_D$ of the first amplification stage is amplified in $-A_1\Delta V_A$: the circuit works quite like a linear amplifier.

However, in addition, since it has been observed that a part of this amplification stage works exactly in the same way as the input bias stage, it is concluded therefrom that the voltage $V_D$ is stabilized in the same way as the bias voltage $V_A$ of the transistor 1. Consequently, the bias voltage of the input transistor 14 of a following amplification stage is also amplified. There is therefore matching among the cascaded stages of an amplifier with several stages.

Let us now consider an amplifier having two amplification stages as shown in FIG. 3. The second amplification stage will work in exactly the same way as the first amplification stage, and if E designates the point common to the drains of the differential amplifier, formed by the transistors 14 and 15, and the transistor 81, and if F designates the point common to the shifting diodes 101 and 111, the drain of the transistor 121 and the gate of the transistor 15, we get, in the same way as earlier $$I_E = I_{14} + I_{15}$$

$$I_E = G_{14}(V_D - V_T) + G_{15}(V_F - V_T) \quad (4)$$

$G_{14}$ and $G_{15}$ being the transconductance values of the transistors 14 and 15, VD being the voltage applied to the gate of the input transistor 14, $V_F$ being the output voltage applied to the gate of the transistor 15, $V_T$ being their common threshold voltage which is the same for all the transistors of the integrated circuit Since $V_D$ is fixed by the equation 2, the equation 4 fixes the voltage $V_F$.

In the same way as previously, we obtain the amplification in small signals:

$$\Delta V_F = -\frac{G_{14}}{G_{15}} \Delta V_D = -A_2 \Delta V_D$$

whence: $V_F = A_1 A_2 \Delta V_A$

The two amplification stages give a gain in decibels which is the sum of the gains in decibels of each stage.

The output signals at the point F of the second stage can be amplified by a last power stage, formed by a transistor 16, which enables the output of signals which can be used in 50-Ohm connections for example.

The amplifier described thus has sections which are of the linear type, such as the differential amplifiers of the two stages, as well as sections for which the diagram is known per se but which are habitually used in logic type circuits. This alliance between logic circuits and linear circuits enables the matching of the stages with one another and the keeping of the amplifier transistors at their preferred bias point.

This amplifier can be used in wide band microwave circuits but it is, furthermore, an excellent amplifier of logic signals. In digital transmissions, for example, the signals are weakened after having travelled a long distance. To regenerate the logic signals, they can be preferably amplified on line, by means of the amplifier according to the invention, and this gives logic signals which are amplified and reshaped by means of the amplification.

What is claimed is:

1. A basing circuit, for the biasing at neutral point of the gate of an input transistor wherein said biasing circuit is formed by a BFL type logic circuit comprising:
    a inverter formed by a transistor and its active load, powered from a first voltage source;
    a shifter formed by a transistor with its gate connected to the drain of the transistor of the inverter, and with its source connected to at least one diode and one transistor which is a current source, the shifter being powered between the first voltage source and a second negative voltage source,
    the input signal being applied simultaneously to the gate of the transistor of the inverter and to the gate of the input transistor of the amplifier, and gate of the input transistor being furthermore connected to the output point of the shifter, common to the cathode of the diode and to the drain of the current source transistor.

2. A microwave linear amplifier including the biasing circuit of claim 1, further comprising at least one amplification stage, the input transistor of which has its gate biased, at neutral point, by a BFL type logic circuit; the amplification stage of said amplifier comprising:
    a differential amplifier formed by said input transistor and by a second transistor, their sources being connected to the ground and their drains being connected together;
    a self-matching circuit of the BFL type, for which the input transistor of the stage also forms the input transistor of the inverter, the output of the shifter of this BFL circuit being connected to the gate of the second transistor of the differential amplifier and to a load, the bias voltage of which, at neutral point, is thus self-matched and follows the bias voltage of the gate of the input transistor.

3. A biasing circuit according to claim 1, wherein the bias voltage, at neutral point, of the gate of the input transistor is defined by the equation:

$$I_B = G_7(V_A - V_T)$$

$I_B$ being the current that flows through the inverter transistor with a transconductance $G_7$, $V_T$ being the threshold voltage common to all the transistors of the circuit.

4. A biasing circuit according to claim 1, wherein the shifter in the BFL type circuit stabilizes the bias voltage, at neutral point, of the gate of the input transistor at its equilibrium point.

5. A biasing circuit according to claim 2, wherein the bias voltage, at neutral point, of the gate of the second transistor of the differential amplifier is self-matched as a function of the bias voltage, at neutral point, of the input transistor gate, according to the equation:

$$\Delta V_D = -\frac{G_1}{G_{13}} \Delta V_A = -A_1 \Delta V_A$$

wherein
- $G_1$ is the transconductance of the input transistor,
- $G_{13}$ is the transconductance of the second transistor of the differential amplifier,
- $A_1 = G_1/G_{13}$ is the amplification factor.

6. A biasing circuit according to claim 2, wherein several amplification stages can be cascaded, the bias voltages at neutral point being self-matched.

7. A biasing circuit according to claim 1, wherein the pass band of these biasing and self-matching circuits is the same as that of the amplification circuits, all the transistors of this amplifier being made with the same technology.

8. A biasing circuit according to claim 1, made as an integrated circuit, on a fast material of the III-V group, such as GaAs.

* * * * *

UNITED STATES PATENT AND TRADEMARK OFFICE
CERTIFICATE OF CORRECTION

PATENT NO. : 4,881,046
DATED : Nov. 14, 1989
INVENTOR(S) : Pham N. Tung

It is certified that error appears in the above-identified patent and that said Letters Patent is hereby corrected as shown below:

On the title page:

The Assignee is recorded incorrectly, should be:

--Thomson Hybrides et Microondes--

Signed and Sealed this

Twenty-second Day of January, 1991

Attest:

HARRY F. MANBECK, JR.

*Attesting Officer*   *Commissioner of Patents and Trademarks*